(12) United States Patent
Dubois et al.

(10) Patent No.: US 8,541,301 B2
(45) Date of Patent: Sep. 24, 2013

(54) REDUCTION OF PORE FILL MATERIAL DEWETTING

(75) Inventors: Geraud Jean-Michel Dubois, San Jose, CA (US); Theo J. Frot, Los Gatos, CA (US); Teddie P. Magbitang, San Jose, CA (US); Willi Volksen, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/180,734

(22) Filed: Jul. 12, 2011

(65) Prior Publication Data

US 2013/0017688 A1    Jan. 17, 2013

(51) Int. Cl.
*H01L 21/4763* (2006.01)

(52) U.S. Cl.
USPC .......................................................... 438/618

(58) Field of Classification Search
USPC .......................................................... 438/618
See application file for complete search history.

(56) References Cited

U.S. PATENT DOCUMENTS

| | | | |
|---|---|---|---|
| 5,895,263 A | 4/1999 | Carter et al. | |
| 6,399,666 B1 | 6/2002 | Hawker et al. | |
| 6,451,712 B1 | 9/2002 | Dalton et al. | |
| 6,703,324 B2 | 3/2004 | Wong | |
| 6,800,330 B2 | 10/2004 | Hayashi et al. | |
| 6,893,985 B2 | 5/2005 | Goodner | |
| 6,924,222 B2 | 8/2005 | Goodner et al. | |
| 7,071,091 B2 | 7/2006 | Clarke et al. | 438/622 |
| 7,229,934 B2 | 6/2007 | Dubois et al. | |
| 7,265,437 B2 | 9/2007 | Nguyen et al. | |
| 7,282,458 B2 | 10/2007 | Gates et al. | |
| 7,288,292 B2 | 10/2007 | Gates et al. | |
| 7,303,989 B2 | 12/2007 | Boyanov et al. | |
| 7,312,524 B2 | 12/2007 | Gates et al. | |
| 7,399,715 B2 | 7/2008 | Tsuchiya et al. | |
| 7,422,975 B2 | 9/2008 | Nogami et al. | |
| 7,462,678 B2 | 12/2008 | Akiyama et al. | |
| 7,479,306 B2 | 1/2009 | Edelstein et al. | |
| 7,510,982 B1 | 3/2009 | Draeger et al. | 438/783 |
| 7,629,272 B2 | 12/2009 | Waldfried et al. | |
| 2006/0024849 A1 | 2/2006 | Zhu et al. | 438/12 |
| 2006/0046044 A1* | 3/2006 | Lee et al. | 428/304.4 |
| 2007/0077782 A1 | 4/2007 | Lee et al. | 438/781 |

(Continued)

OTHER PUBLICATIONS

"The Structure of Poly(cyano-p-xylylene)"; S-Y.Park, J, Blackwell, S.N. Chvalun, A.A. Nilolaef, K.A. Mailyan, A.V. Pebalk, I.E. Kardash; Jul. 22, 1998.*

(Continued)

*Primary Examiner* — Charles Garber
*Assistant Examiner* — Andre' C Stevenson
(74) *Attorney, Agent, or Firm* — Harrington & Smith

(57) ABSTRACT

In one exemplary embodiment, a method includes: providing a structure having a first layer overlying a substrate, where the first layer includes a dielectric material having a plurality of pores; applying a filling material to a surface of the first layer, where the filling material includes a polymer and at least one additive, where the at least one additive includes at least one of a surfactant, a high molecular weight polymer and a solvent; and after applying the filling material, heating the structure to enable the filling material to at least partially fill the plurality of pores uniformly across an area of the first layer, where heating the structure results in residual filling material being uniformly left on the surface of the first layer.

16 Claims, 9 Drawing Sheets

(A) COAT WITH POLYMER  (B) HEAT ABOVE Tg OF POLYMER  (C) REMOVE EXCESS POLYMER  (D)

(56) References Cited

U.S. PATENT DOCUMENTS

| | | |
|---|---|---|
| 2007/0184222 A1 | 8/2007 | Delouise et al. |
| 2008/0009141 A1 | 1/2008 | Dubois et al. |
| 2009/0140418 A1 | 6/2009 | Li et al. ............ 257/734 |
| 2009/0317971 A1 | 12/2009 | Cui et al. ............ 438/618 |

OTHER PUBLICATIONS

Crystal Structures, Molecular Modeling and Morphology of Poly (1,5-naohthalene-benzobisoxaxole) and Poly(2,6-naphthalene-benzobisoxazole); S-Y.Park, J, Blackwell, S.N. Chvalun, A.A. Nilolaef, K.A. Mailyan, A.V. Pebalk, I.E. Kardash; Jul. 22, 1998.*

"Infiltrating Semiconducting Polymers into Self-Assembled Mesoporous Titania Films for Photovoltaic Applications", Kevin M. Coakley, et al., Advanced Functional Materials, vol. 13, No. 4, Apr. 2003, p. 301-306.

"Homogeneous Porous Low Dielectric Constant Materials", U.S. Appl. No. 13/010,004, filed Jan. 20, 2011, 50 pgs.

Kropka et al., "Control of Interfacial Instabilities in Thin Polymer Films with the Addition of a Miscible Component", American Chemical Society, (2006), (pp. 8758-8762).

Barnes, et al., "Suppression of Dewetting in Nanoparticle-Filled Polymer Films", American Chemical Society, (2000), (pp. 4177-4185).

Choi, et al., "Suppress Polystyrene Thin Film Dewetting by Modifying Substrate Surface with Aminopropylthriethoxysilance", Science Direct, (2006), (pp. 1391-1404).

Luzinov, et al., "Thermoplastic Elastomer Monolayers Grafted to a Functionalized Silicon Surface", American Chemical Society, (2000), (pp. 7629-7638).

Mackay, et al., "Influence of Dendrimer Additives on the Dewetting of Thin Polystyrene Films", American Chemical Society, (2002), (pp. 1877-1882).

Ryu, et al., "A Generalized Approach to the Modification of Solid Surfaces", vol. 308 (Apr. 8, 2005), (pp. 236-239).

\* cited by examiner

| Substrate | CA | Polymer Film *from JSR | Additive | Dewet Start Temp |
|---|---|---|---|---|
| k=2.2 POCS | 73° | MT0010* | Pristine | 175°C |
| k=2.2 POCS | 73° | MT0010* | 2% DPG | 200°C |
| k=2.2 POCS | 73° | MT0010* | 5% DPG | 225°C |
| k=2.2 POCS | 73° | MT0010* | 10% DPG | 250°C |
| k=2.2 POCS | 73° | MT0010* | 2% TEG | 200°C |
| k=2.2 POCS | 73° | MT0010* | 5% TEG | 225°C |
| k=2.2 POCS | 73° | MT0010* | 10% TEG | No Dewet at 250°C |

| Substrate | CA | Polymer Film *from JSR | Additive | Dewet Start Temp |
|---|---|---|---|---|
| k=2.2 POCS | 73° | MT0010* | Pristine | 175°C |
| k=2.2 POCS | 73° | MT0010* | 2% FC4430 | 175°C |
| k=2.2 POCS | 73° | MT0010* | 2% Pluronic P85 | No Dewet at 250°C |
| k=2.2 POCS | 73° | MT0010* | 2% Pluronic P103 | 200°C |
| k=2.2 POCS | 73° | MT0010* | 2% Pluronic P105 | 200°C |
| k=2.2 POCS | 73° | MT0010* | 2% Pluronic L121 | 175°C |
| k=2.2 POCS | 73° | MT0010* | 2% Tetronic 90R4 | 175°C |
| k=2.2 POCS | 73° | MT0010* | 2% Tween 65 | 175°C |
| k=2.2 POCS | 73° | MT0010* | 2% Tween 85 | 175°C |
| k=2.2 POCS | 73° | MT0010* | 2% Brij 97 | 175°C |
| k=2.2 POCS | 73° | MT0010* | 2% Brij 35 | 175°C |
| k=2.2 POCS | 73° | MT0010* | 2% Brij 56 | 225°C |
| k=2.2 POCS | 73° | MT0010* | 2% Brij 58 | 250°C |
| k=2.2 POCS | 73° | MT0010* | 2% Brij 72 | No Dewet at 250°C |
| k=2.2 POCS | 73° | MT0010* | 2% Brij 76 | 175°C |
| k=2.2 POCS | 73° | MT0010* | 2% Brij 85 | 250°C |
| k=2.2 POCS | 73° | MT0010* | 2% Brij 97 | 225°C |
| k=2.2 POCS | 73° | MT0010* | 2% Brij 52 | 175°C |
| k=2.2 POCS | 73° | MT0010* | 2% Brij 78 | 175°C |
| k=2.2 POCS | 73° | MT0010* | 2% Brij 98 | 175°C |

FIG. 11

| Substrate | CA | Polymer Film *from JSR | Additive | Dewet Start Temp |
|---|---|---|---|---|
| k=2.2 POCS | 73° | MT0123* | Pristine | 125°C |
| k=2.2 POCS | 73° | MT0123* | 2% TEG | 150°C |
| k=2.2 POCS | 73° | MT0123* | 2% Pluronic P85 | 175°C |
| k=2.2 POCS | 73° | MT0123* | 2% TEG + 2% Pluronic P85 | 200°C |

FIG. 13

| Porous Film | Density (g/cm³) | Thickness (nm) | Refractive Index | Porosity | Pore Size Diameter (nm) |
|---|---|---|---|---|---|
| POCS-1 | 1.085 | 570 | 1.343 | 27.1% | 1.3 – 2.1 |
| POCS-2 | 1.111 | 420 | 1.353 | 27.1% | 1.3 – 2.1 |

FIG. 14

| Example | Polymer Solution | POCS Film | Dewet Start Temp |
|---|---|---|---|
| Example 1 | Poly-1 | POCS-1 | 190°C |
| Example 2 | Poly-2 | POCS-1 | 160°C |
| Example 3 | Poly-3 | POCS-2 | 160°C |
| Example 4 | Poly-4 | POCS-2 | 110°C |
| Example 5 | Poly-5 | POCS-2 | No Dewet at 200°C |
| Example 6 | Poly-6 | POCS-2 | No Dewet at 200°C |

FIG. 15

REDUCTION OF PORE FILL MATERIAL DEWETTING

TECHNICAL FIELD

The exemplary embodiments of this invention relate generally to semiconductor devices and, more specifically, relate to porous dielectric materials.

BACKGROUND

This section endeavors to supply a context or background for the various exemplary embodiments of the invention as recited in the claims. The content herein may comprise subject matter that could be utilized, but not necessarily matter that has been previously utilized, described or considered. Unless indicated otherwise, the content described herein is not considered prior art, and should not be considered as admitted prior art by inclusion in this section.

It is widely known that the speed of propagation of interconnect signals is one of the most important factors controlling overall circuit speed as feature sizes are reduced and the number of devices per unit area increases. Throughout the semiconductor industry, there is a strong drive to reduce the dielectric constant (k) of the interlayer dielectric (ILD) materials such as those existing between metal lines, for example. As a result of such reduction, interconnect signals travel faster through conductors due to a concomitant reduction in resistance-capacitance (RC) delays.

Porous ultra low-k (ULK) dielectrics have enabled capacitance reduction in advanced silicon complementary metal-oxide semiconductor (CMOS) back end of line (BEOL) structures. However, the high levels of porosity required (e.g., to achieve k values of 2.4 and lower) create issue in terms of dielectric material damage or loss due to plasma exposures (e.g., reactive ion etch (RIE), strip, dielectric barrier etch) and wet cleans (e.g., post RIE dilute hydrofluoric acid (DHF) cleans). Additionally, penetration of metals used in the liner layer (e.g., Ta, TaN) or the seed layer (e.g., Cu, Ru) into the pores of the dielectric can occur when porosity is high and the material is characterized by a high degree of pore connectivity. This leads to degradation of the dielectric break down strength and degradation of the leakage characteristics of the dielectric. All of these issues collectively may cause reliability and performance degradation in BEOL structures made using highly porous ULK dielectrics.

Although the design of a low-k dielectric material with desirable properties for implementation is demanding enough, the complexity of modern semiconductor manufacturing processes adds further complications. Some of these are a direct result from trying to utilize $SiO_2$-based processes with porous, low-k dielectric materials that are considerably less forgiving. In this regard, adding porosity may not result in redeeming values (e.g., improved characteristics) other than lowering the dielectric constant. Critical damage to the low dielectric porous material can occur at different stages of the integration process, including: hard-mask deposition, reactive ion etch, photoresist strip, liner deposition, chemical mechanical polishing, and cap deposition, as non-limiting examples.

BRIEF SUMMARY

In one exemplary embodiment of the invention, a method comprising: providing a structure comprising a first layer overlying a substrate, where the first layer comprises a dielectric material having a plurality of pores; applying a filling material to a surface of the first layer, where the filling material comprises a polymer and at least one additive, where the at least one additive comprises at least one of a surfactant, a high molecular weight polymer and a solvent (e.g., a high boiling point solvent); and after applying the filling material, heating the structure to enable the filling material to at least partially fill the plurality of pores uniformly across an area of the first layer, where heating the structure results in residual filling material being uniformly left on the surface of the first layer.

In another exemplary embodiment of the invention, a program storage device readable by a machine, tangibly embodying a program of instructions executable by the machine for performing operations, said operations comprising: providing a structure comprising a first layer overlying a substrate, where the first layer comprises a dielectric material having a plurality of pores; applying a filling material to a surface of the first layer, where the filling material comprises a polymer and at least one additive, where the at least one additive comprises at least one of a surfactant, a high molecular weight polymer and a solvent (e.g., a high boiling point solvent); and after applying the filling material, heating the structure to enable the filling material to at least partially fill the plurality of pores uniformly across an area of the first layer, where heating the structure results in residual filling material being uniformly left on the surface of the first layer.

In a further exemplary embodiment of the invention, a method comprising: providing a structure comprising a first layer overlying a substrate, where the first layer comprises a dielectric material having a plurality of pores; applying a filling material to a surface of the first layer, where the filling material comprises a polymer and at least one additive, where the at least one additive comprises at least one of a surfactant, a high molecular weight polymer and a solvent having a boiling temperature between 100° C. and 300° C., where the at least one additive is operable to raise a dewet start temperature of the filling material, where the dewet start temperature is a temperature at which the surface of the first layer begins to dewet, where the at least one additive is thermally removable, where the high molecular weight polymer has a molecular weight about or greater than 2000 g/mol, where the at least one additive is selected based on one or more of: a thickness of the first layer, the dielectric material, the filling material, a temperature used to heat the structure and enable the filling material to at least partially fill the plurality of pores, a heating time, and pore size of the plurality of pores; and after applying the filling material, heating the structure to enable the filling material to at least partially fill the plurality of pores uniformly across an area of the first layer, where heating the structure results in residual filling material being uniformly left on the surface of the first layer.

BRIEF DESCRIPTION OF THE SEVERAL VIEWS OF THE DRAWINGS

The foregoing and other aspects of embodiments of this invention are made more evident in the following Detailed Description, when read in conjunction with the attached Drawing Figures, wherein:

FIG. 11 shows experimental evidence for exemplary embodiments of the invention whereby a surfactant is added to the filling material;

FIG. 13 shows experimental evidence for exemplary embodiments of the invention whereby a solvent (TEG), a surfactant (Pluronic P85) and both a solvent and a surfactant (TEG+Pluronic P85) are added to the filling material;

FIG. 14 shows analysis data for two porous films, POCS-1 and POCS-2, used in various descriptive examples;

FIG. 15 shows data for six examples, at least some of which are in accordance with the exemplary embodiments of the invention;

DETAILED DESCRIPTION

One technique for addressing the above-noted issues is to fill the pores of the dielectric with a filling material (e.g., a polymer). One prior art technique, as disclosed by U.S. Pat. No. 6,703,324, introduces a secondary component into the void fraction of a porous medium (low dielectric constant film) in order to temporarily improve the mechanical properties such that the porous film has mechanical characteristics of a much stiffer film. Once a process operation such as a chemical mechanical polishing process, which requires greater mechanical strength than that provided by the porous film alone, is completed, the secondary component is removed by displacement or dissolution. Another prior art technique, as disclosed by U.S. Pat. No. 7,303,989, impregnates the pores of a zeolite low-k dielectric layer with a polymer and forms an interconnect structure therein. This mechanically strengthens the dielectric layer and prevents metal deposits within the pores.

Reference is made to commonly-assigned U.S. patent application Ser. No. 13/010,004, filed Jan. 20, 2011, concerning porous dielectric fill methods, techniques, devices, structures and aspects thereof.

Figure 1:
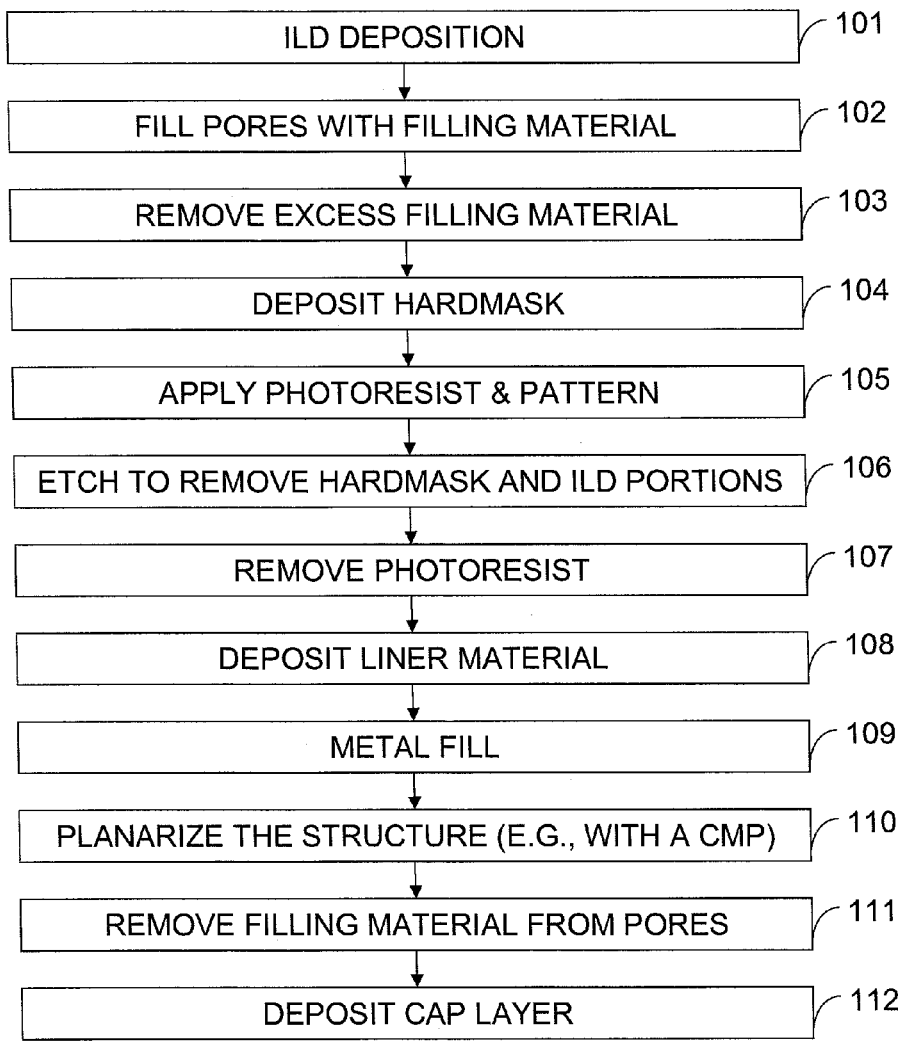
FIG. 1 shows a flowchart illustrating one non-limiting example of a method for practicing the exemplary embodiments of this invention.

Below, and with reference to FIGS. 1-8, is described one, non-limiting exemplary embodiment illustrating how filling the pores of a porous dielectric film (e.g., a low-k or ULK dielectric film) may be beneficial for processing carried out on the wafer. FIG. 1 depicts a flowchart illustrating one non-limiting example of such a method and is further referred to below with reference to FIGS. 2-8. It is noted that the described exemplary method is for forming a single damascene interconnect structure. In other exemplary embodiments, a different structure may be formed and/or utilized.

Figure 2:
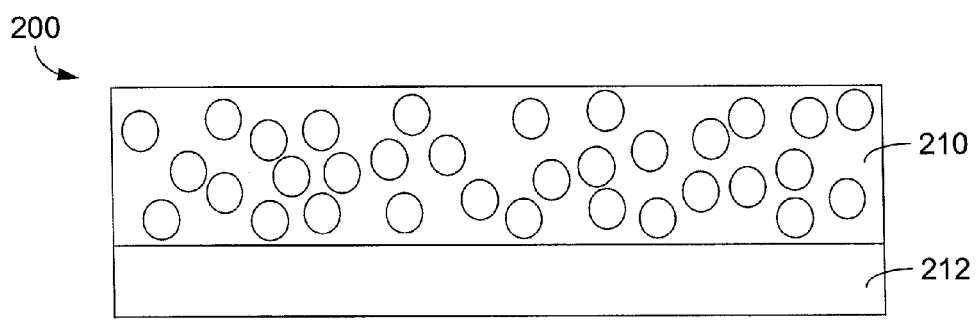
FIGS. 2-8 show a semiconductor wafer at various stages of processing in practicing the exemplary method depicted in FIG. 1.

In FIG. 2 (step 101 of FIG. 1), a semiconductor wafer 200 that has a previous interconnect layer 212 deposited on top is first coated with an ILD layer 210 of a porous material containing empty pores (e.g., an organosilicate), for example, deposited by the best known techniques. As an example, the interconnect layer 212 may be suitably formed of single or dual damascene wiring with a high electrical conductivity material (e.g., copper, aluminum, alloys thereof) embedded in a suitable ILD (porous or nonporous) and optionally capped with a diffusion barrier dielectric (e.g., SiN, NBLoK). Detailed make up of layer 212 is omitted in FIGS. 2-8 for purposes of clarity.

Figure 3:
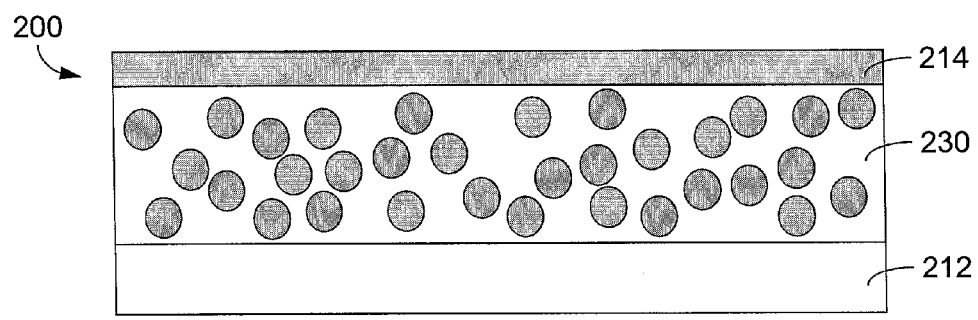

In FIG. 3 (step 102 of FIG. 1), the pores of the porous dielectric are filled with a filling material (e.g., an organic polymer 214) by depositing the filling material on the porous dielectric and heating the filling material above the glass transition temperature (Tg) to allow it to flow into the pores. There is an excess layer of the polymer 214 that forms at the surface of the filled ILD film 230.

Figure 4:
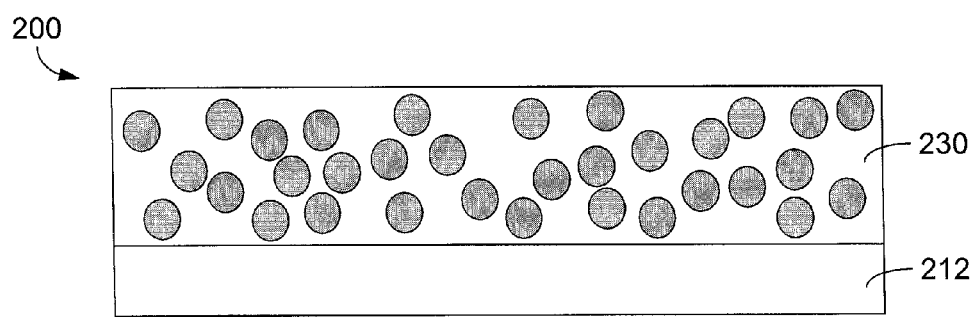

In FIG. 4 (step 103 of FIG. 1), the excess of organic polymer 214 that was deposited on top of the filled ILD film 230 is then removed by a suitable method, such as plasma etch, RIE strip, wet dissolution or gentle polishing. Care should be exercised not to remove the polymer from the filled pores in the structure.

Figure 5:
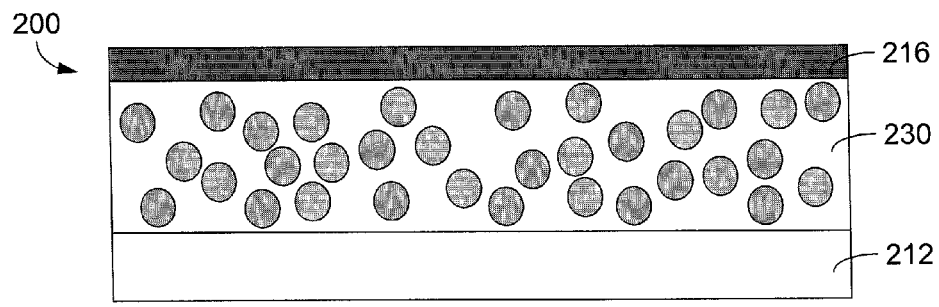

In FIG. 5 (step 104 of FIG. 1), a hardmask layer 216 is deposited on top of the filled ILD layer 230, for example, using plasma enhanced chemical vapor deposition (PECVD) or spin-on techniques. The hardmask 216 can be formed of any suitable material including, as non-limiting examples, $SiO_2$, $Al_2O_3$, SiN, $Si_3N_4$, SiC, SiCOH or another suitable hardmask material as known in the art. The hardmask layer 216 may further be formed by more than one layer of material, though the total thickness preferably should be less than 250 nm and, more preferably, less than 100 nm.

In step 105 of FIG. 1, a photoresist layer is applied to the top of the hardmask layer 216, exposed to generate a desired pattern, developed and then baked (e.g., at a temperature on the order of 200° C. or less).

In step 106 of FIG. 1, the hardmask layer 216 and the filled ILD layer 230 are etched (e.g., in a plasma etching process) to remove them in those regions defined by openings in the photoresist pattern on top of the hardmask layer 216.

In step 107 of FIG. 1, any remnants of the resist layer are removed by a strip process. It should be noted that this is the step where the porosity of the organosilicate is exposed to the strip process chemistry used to remove the photoresist and damage would otherwise occur to the pores of the filled ILD layer 230 if they were not filled with the polymer. Without first filling the pores, after such an exposure the dielectric constant and the leakage current of the ILD increase significantly. In contrast, as the ILD is in a nonporous hybrid state enriched in carbon due to the fill material now present in the original pores, little or no damage occurs to the filled ILD layer 230.

In step 108 of FIG. 1, a liner material is deposited to form a liner layer 222 on top of the hardmask layer 216. The liner layer 222 may be comprised of a material such as TaN, TiN, Ti, Ta, or various combinations thereof, as non-limiting examples, for achieving adhesion and diffusion barrier properties.

At this stage, in some exemplary embodiments a seed layer (e.g., copper) is deposited on top of the liner layer 222. The seed layer may be deposited by sputtering, for example, and may be used to facilitate subsequent electroplating.

In step 109 of FIG. 1, the etched opening is filled with a metal 224, such as copper, for example. The metal may be formed by electroplating, for example, and overfills the opening.

In step 110 of FIG. 1, after the etched opening is filled with the metal 224, the electronic structure 200 is planarized (e.g., by a chemical mechanical polishing (CMP) process) to achieve a planar surface with a metal inlaid structure. In this CMP step, polishing is performed until all of the excess metal, liner and hardmask on top of the filled ILD layer 230 are removed, thus exposing at least a top surface of the filled ILD layer 230.

Figure 6:
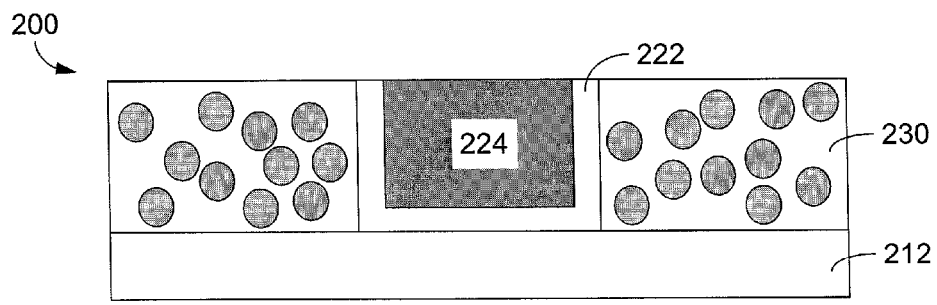

FIG. 6 shows the electronic structure 200 after performance of steps 105-110 noted above.

Figure 7:
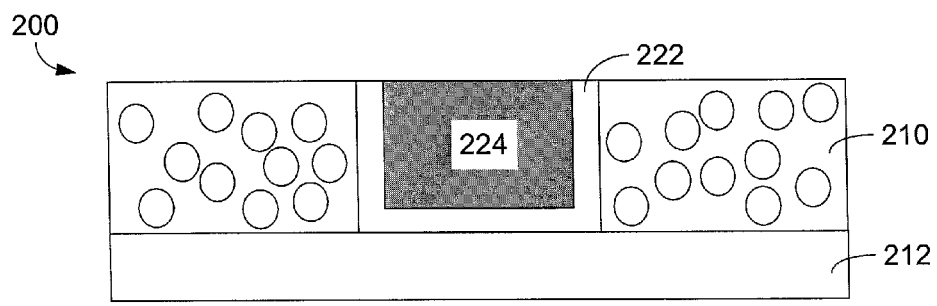

In FIG. 7 (step 111 of FIG. 1), the filling material (e.g., the organic polymer) is removed from the pores, for example, by decomposing it using a thermal curing or a thermal curing assisted by ultraviolet (UV) irradiation, as non-limiting examples.

Figures 8, 12:
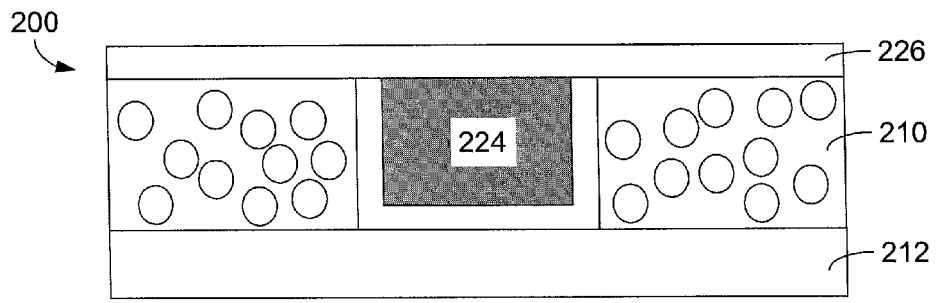
FIG. 12 shows experimental evidence for exemplary embodiments of the invention whereby a solvent (e.g., a high boiling point solvent) is added to the filling material.

In FIG. 8 (step 112 of FIG. 1), a cap layer 226 of an insulating material (e.g., silicon carbide, silicon nitride, silicon carbonitride, combinations thereof) is deposited on top in order to prevent diffusion of the metal and to protect the electronic device 200 (e.g., from mechanical abrasion or other damage).

As described above, by filling the pores of the porous ILD (e.g., with a polymer), damage to the ILD (e.g., to the pores of the ILD) can be avoided during processing of the structure. Also as noted above, much of the potential for damage stems from the strip process chemistry used to remove the photoresist. Without filling the pores, the dielectric constant and the leakage current of the ILD may be adversely affected (e.g., significantly increased). Generally, when filling the porous dielectric with the filling material it is desirable to achieve uniform coverage (e.g., full, even coverage across the surface of the dielectric resulting in an even, continuous film) with the deposited filling material in order to obtain homogeneous filling of the pores (substantially even distribution of the filling material throughout the thickness of the porous material).

Figure 9:
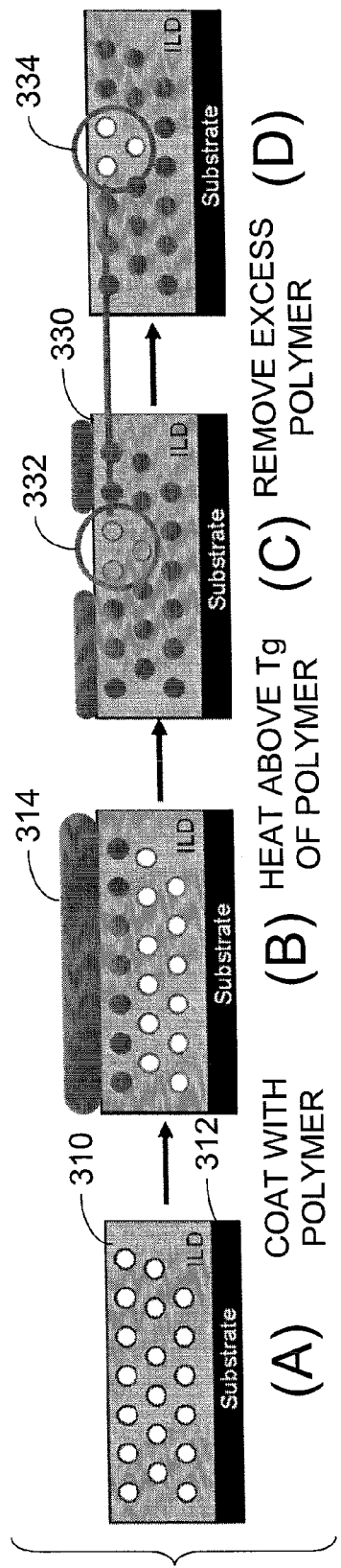
FIG. 9 shows a semiconductor structure wherein dewetting occurs when portions of the surface of the dielectric are exposed after filling the pores with the filling material.

In view of this goal, it is further desirable to avoid dewetting of the filling material during filling of the porous material. As shown in FIG. 9, and as a non-limiting example, dewetting occurs when portions of the surface of the dielectric are exposed after filling the pores with the filling material (e.g., a polymer). In FIG. 9A, a porous ILD 310 is shown disposed over a substrate 312. In FIG. 9B, the structure is coated with a polymer 314 that will be used to fill the pores. In FIG. 9C, the polymer is heated above its glass transition temperature (Tg) to enable it to fill the pores (yielding a filled porous dielectric 330). As can be seen in FIG. 9C, this operation results in exposure of a portion of the surface of the ILD 332. In FIG. 9D, the excess polymer on the surface of the ILD is removed by a suitable means. Since there is non-uniform coverage by the excess polymer, the removal of the excess polymer from the surface of the ILD also removes the polymer from some of the pores resulting in inhomogeneous filling of the pores 334. Clearly this is not a desirable result. Furthermore, this may lead the structure to be incompatible with integration.

Various prior art documents have considered dewetting of polymer films, including:

(A) K. A. Barnes et al. Suppression of Dewetting in Nanoparticle-Filled Polymer Films, *Macromolecules* 2000, 33, 4177-4185;

(B) M. E. Mackay et al. Influence of Dendrimer Additives on the Dewetting of Thin Polystyrene Films, *Langmuir* 2002, 18, 1877-1882;

(C) J. M. Kropka et al. Control of Interfacial Instabilities in Thin Polymer Films with the Addition of a Miscible Component, *Macromolecules* 2006, 39, 8758-8762;

(D) D Y Ryu et al. A Generalized Approach to the Modification of Solid Surfaces, *Science* 8 Apr. 2005, 308, 236-239;

(E) S H Choi et al. Suppress polystyrene thin film dewetting by modifying substrate surface with aminopropyltriethoxysilane, *Surface Science* 2006, 600, 1391-1404; and (F) I. Luzinov et al. Thermoplastic elastomer monolayers grafted to a functionalized silicon surface, *Macromolecules* 2000, 33, 7629-7638.

It is noted that for references A, B and C the structure must be heated to over 400° C. to decompose the additive and this process leaves a residue. In contrast, exemplary embodiments of the invention, as described below, comply with dielectric processing and do not require heating above 425° C. (e.g., above 400° C.) to completely remove all filling material and additives. Furthermore, exemplary embodiments of the invention do not result in residue remaining on the surface in question. Preferably, no excess polymer is left on the surface.

For references D, E and F, it is noted that these references consider a non-porous film. They do not discuss porous films. Furthermore, they anchor the polymer to the film using a chemical bond. In contrast, exemplary embodiments of the invention do not use or require such a chemical bond, said chemical bond being undesirable for dielectric processing.

Dewetting of the polymer on the low-k dielectric film is observed when heating above Tg: (a) due to loss of solvent in the polymer film presenting unfavorable surface energy interactions; and/or (b) due to non-entanglement of low molecular weight polymer chains. Surface energy interactions can be modified by the addition of diluents and/or surfactants to the polymer.

Figure 10:
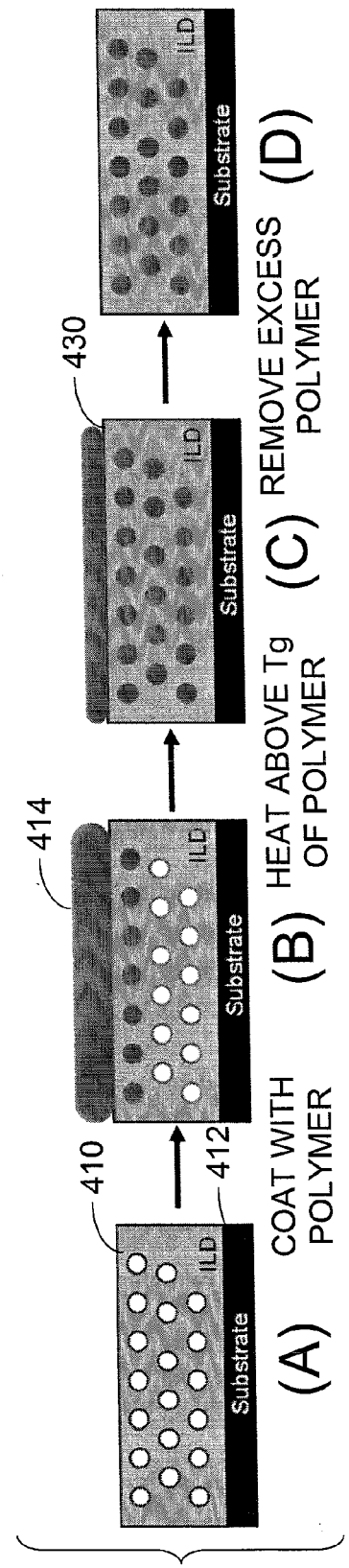
FIG. 10 shows one exemplary embodiment of the invention that avoids the dewetting of FIG. 9 by including at least one additive in the filling material.

Exemplary embodiments of the invention use a polymer formulation to fill the pores of the porous dielectric. The polymer formulation results in uniform coverage by the excess polymer (e.g., across an area of the surface of the dielectric) and, thus, (substantially) homogeneous filling of the pores. Furthermore, usage of the polymer formulation avoids dewetting of the excess polymer and yields a structure that is compatible with integration. FIG. 10 shows one exemplary embodiment of the invention that avoids the dewetting of FIG. 9 by including at least one additive in the filling material. In FIG. 10A, a porous ILD 410 is shown disposed over a substrate 412. In FIG. 10B, the structure is coated with a polymer 414 that will be used to fill the pores. In FIG. 10C, the polymer is heated above its glass transition temperature (Tg) to enable it to fill the pores (yielding a filled porous dielectric 430). In FIG. 10D, the residual (e.g., excess) polymer on the surface of the ILD is by a suitable means. Since there is uniform coverage by the residual polymer, the removal of the residual polymer from the surface of the ILD does not remove the polymer from any of the pores, resulting in homogeneous filling of the pores.

As noted above, heating the structure enables the filling material to at least partially fill the plurality of pores uniformly across an area of the first layer. The area of the first layer is considered generally to be a horizontal plane (substantially) perpendicular to the depth or thickness of the first layer. The area of the first layer will, at one point, be coincident (roughly/approximately or precisely) with the surface of the first layer (i.e., the surface to which the filling material is applied). As is clear, the uniformity considered herein generally is across the horizontal plane (e.g., the area) of the first layer, both with respect to pore-filling and disposition of the residual polymer on the surface of the first layer.

As a non-limiting example, the polymer formulation may comprise a polymer (e.g., a low molecular weight polymer) to which at least one of a surfactant, a high molecular weight polymer and a solvent (e.g., a high boiling point solvent) has been added. These additives are thermally removable in order to comply with integration needs. That is, these additives must be removed at the end of the process and the structure can only be heated up to 425° C. under inert atmosphere. Beyond that temperature, further, desirable components break down.

As referred to herein, a solvent is considered to be a liquid material that dissolves another material (a liquid, solid or gaseous solute) resulting in a solution. A high boiling point (HBP) solvent generally refers to a solvent that has a boiling point greater than or equal to 150° C. (e.g., greater than or equal to 200° C.). A surfactant is considered to be a material or compound that lowers the surface tension of a liquid, the interfacial tension between two liquids or the interfacial tension between a liquid and a solid. As an example, the surfactant may comprise an organic compound that is amphiphilic (meaning it contains hydrophobic groups and hydrophilic groups).

As non-limiting examples, the surfactant may be selected from the group of amphiphilic surfactants comprising block or graft copolymers such as poly(styrene-co-ethylene oxide), poly(styrene-co-propylene oxide), poly(alkane-co-ethylene oxide), poly(alkane-co-propylene oxide), poly(ether-co-lactones), poly(ester-co-carbonates), poly(ethylene oxide-co-propylene oxide), poly(ethylene oxide-co-propylene oxide-co-ethylene oxide) and poly(propylene oxide-co-ethylene oxide-co-propylene oxide). As further non-limiting examples, the solvent may be selected from the group of polymer compatible diluents with a boiling point higher than the polymer Tg, such as oligo(ethylene glycols), oligo(propylene glycols), N-methyl pyrrolidone, dimethylformamide, dimethylsulfoxide, g-butyrolactone, cyclohexanone, cyclopentanone, xylenes, mesitylene.

It should be noted that for at least some exemplary embodiments wherein the at least one additive includes a HBP solvent, the HBP solvent is different from other solvents that may be used such as those used to dissolve the polymer, for example. That is, two solvents may be used—a first in which the polymer is dissolved and a second one acting as the at least one additive (e.g., a HBP solvent). The first solvent will evaporate while the second remains (e.g., due to the higher boiling point).

FIG. 11 shows experimental evidence for exemplary embodiments of the invention whereby a surfactant is added to the filling material. FIG. 12 shows experimental evidence for exemplary embodiments of the invention whereby a solvent (e.g., a high boiling point solvent) is added to the filling material. FIG. 13 shows experimental evidence for exemplary embodiments of the invention whereby a solvent (TEG), a surfactant (Pluronic P85) and both a solvent and a surfactant (TEG+Pluronic P85) are added to the filling material.

In FIGS. 11-13, CA stands for contact angle and is indicative of the hydrophilicity of the surface. A surface is considered hydrophilic if water CA is less than 45°, and hydrophobic if water CA is greater than 45°. Pluronic®, Tetronic®, Tween® and Brij® are trade names. DPG stands for di(propylene glycol) and TEG stands for tetra(ethylene glycol). POCS stands for porous oxycarbosilane, the type of porous films used to generate the examples.

The goal is to raise the temperature at which dewet occurs (e.g., to raise the temperature to be as high as possible). The data only goes up to 250° C. since beyond that temperature the chosen polymer will degrade. As is apparent from the data of FIG. 13, in at least some cases it is beneficial to use both a solvent and a surfactant. The selection of which additive(s) to use may be based on one or more of: the thickness of the dielectric, the dielectric material, the polymer fill material, the temperature used to fill the pores with the polymer, heating time, pore size, the process/operations used and/or other factors.

As noted above, in some exemplary embodiments a high molecular weight (HMW) polymer is added to the polymer (e.g., a low molecular weight LMW polymer) which is to penetrate the porosity. Unlike the LMW polymer, the HMW polymer does not penetrate into the porosity and, instead, remains on the surface of the porous dielectric. This allows the LMW polymer to be heated at a higher temperature in order to promote pore filling, while still avoiding dewet.

As referred to herein, a HMW polymer is considered to be a polymer having a molecular weight about or greater than 2000 g/mol (e.g., larger than 10000 g/mol).

As a non-limiting example, the HMW polymer may comprise a high molecular weight form of polystyrene (e.g., polystyrene with a molecular weight of about 9500-10500 g/mol). In some exemplary embodiments, the HMW polymer has a molecular weight about or greater than 7000 g/mol. In further exemplary embodiments, the HMW polymer has a molecular weight about or greater than 8000 g/mol. In other exemplary embodiments, the HMW polymer has a molecular weight about or greater than 9000 g/mol. In further exemplary embodiments, the HMW polymer has a molecular weight about or greater than 10000 g/mol.

Below are provided examples to demonstrate the use of exemplary high molecular weight polymers to prevent dewet (e.g., of a low molecular weight polymer). FIG. 14 shows analysis data for the two porous films used, POCS-1 and POCS-2. FIG. 15 shows data for the six examples considered below.

The following solutions were used:
Poly-1 (Example 1): 5 wt. % poly(methyl methacrylate) (molecular weight Mw=1100 g/mol) and 0.5 wt. % poly(methyl methacrylate) (Mw=9900 g/mol) in Propylene Glycol Methyl Ether Acetate.
Poly-2 (Example 2): 5 wt. % polystyrene (Mw=1000 g/mol) and 0.5 wt. % polystyrene (Mw=10000 g/mol) in Toluene.
Poly-3 (Example 3): 5 wt. % poly(methyl methacrylate) (Mw=1100 g/mol) in Propylene Glycol Methyl Ether Acetate.
Poly-4 (Example 4): 5 wt. % polystyrene (Mw=1000 g/mol) in Toluene.
Poly-5 (Example 5): 5 wt. % poly(methyl methacrylate) (Mw=9900 g/mol) in Propylene Glycol Methyl Ether Acetate.
Poly-6 (Example 6): 5 wt. % polystyrene (Mw=10000 g/mol) in Toluene.

The porous films used (referred to as "POCS-1" and "POCS-2") were synthesized from the same microelectronic grade formulation composed of a thermally stable organosilicate oxycarbosilane polymer and a thermally decomposable organic polymer. POCS-1 and POCS-2 were synthesized by spin-coating the above formulations on 8-inch silicon wafers, applying first a post-applied bake on a hot plate at 85° C. for 2 minutes and then curing the films in a Yield Engineering Systems Inc. (YES®) polyimide bake oven at 250° C. for 15 minutes using a 5° C./min ramp. The films were then cured at 400° C. for 7 minutes under UV irradiation. The porosities of POCS-1 and POCS-2 were measured by ellipsometric porosimetry using toluene as the adsorbent (Kelvin model). The density and thickness were obtained using X-ray reflectivity (XRR) and the refractive index using spectral-reflectometry.

The analysis data is summarized in FIG. 14. The only notable difference between POCS-1 and POCS-2 is the thickness of the film.

Example 1

Poly-1 was spin-coated on top of POCS-1 at 1000 rpm for 30 seconds. POCS-1 was afterwards heated successively at increasing temperatures until dewet was observed. The results are summarized in FIG. 15.

Example 2

Poly-2 was spin-coated on top of POCS-1 at 1000 rpm for 30 seconds. POCS-1 was afterwards heated successively at increasing temperatures until dewet was observed. The results are summarized in FIG. 15.

Example 3

Poly-3 was spin-coated on top of POCS-2 at 1000 rpm for 30 seconds. POCS-2 was afterwards heated successively at increasing temperatures until dewet was observed. The results are summarized in FIG. 15.

Example 4

Poly-4 was spin-coated on top of POCS-2 at 1000 rpm for 30 seconds. POCS-2 was afterwards heated successively at increasing temperatures until dewet was observed. The results are summarized in FIG. 15.

Example 5

Poly-5 was spin-coated on top of POCS-2 at 1000 rpm for 30 seconds. POCS-2 was afterwards heated at 200° C. for 1 minute; the polymer film did not dewet. The excess polymer was then removed and the film was analyzed by spectral reflectometry and x-ray reflectivity. No penetration of the polymer in the pores was detected.

Example 6

Poly-6 was spin-coated on top of POCS-2 at 1000 rpm for 30 seconds. POCS-2 was afterwards heated at 200° C. for 1 minute; the polymer film did not dewet. The excess polymer was then removed and the film was analyzed by spectral reflectometry and x-ray reflectivity. No penetration of the polymer in the pores was detected.

From these 6 examples, one can see that the addition of a HMW polymer to a LMW polymer enables one to increase the dewet temperature and, further, that the HMW polymer does not penetrate into the pores of the porous film.

Below are further descriptions of various non-limiting, exemplary embodiments of the invention. The below-described exemplary embodiments are numbered separately for clarity purposes. This numbering should not be construed as entirely separating the various exemplary embodiments since aspects of one or more exemplary embodiments may be practiced in conjunction with one or more other aspects or exemplary embodiments.

Figure 16:
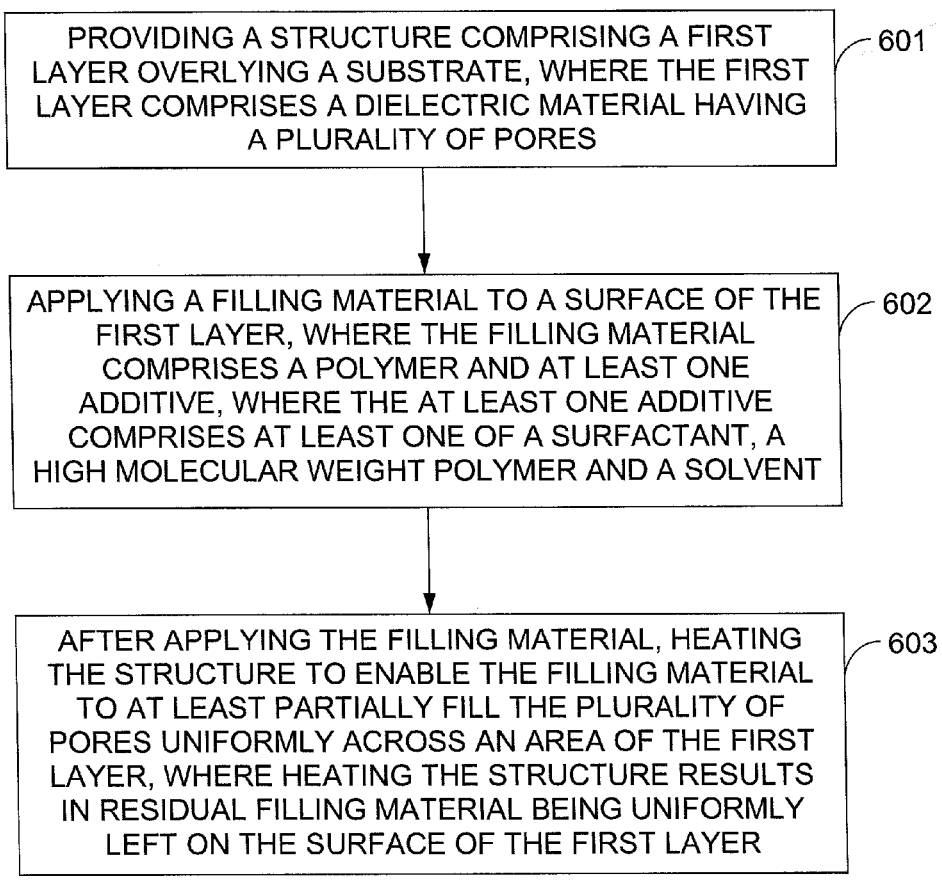
FIG. 16 depicts a flowchart illustrating one, non-limiting example of a method, and execution of program instructions, for practicing the exemplary embodiments of this invention.

(1) In one exemplary embodiment of the invention, and as shown in FIG. 16, a method comprising: providing a structure comprising a first layer overlying a substrate, where the first layer comprises a dielectric material having a plurality of pores (601); applying a filling material to a surface of the first layer, where the filling material comprises a polymer and at least one additive, where the at least one additive comprises at least one of a surfactant, a high molecular weight polymer and a solvent (602); and after applying the filling material, heating the structure to enable the filling material to at least partially fill the plurality of pores uniformly across an area of the first layer, where heating the structure results in residual filling material being uniformly left on the surface of the first layer (603).

A method as above, where the at least one additive is operable to raise a dewet start temperature of the filling material, where the dewet start temperature is a temperature at which the surface of the first layer begins to dewet. A method as in any above, where the at least one additive is operable to reduce or eliminate dewetting of the excess filling material. A method as in any above, where the at least one additive is thermally removable. A method as in any above, where the at least one additive comprises a solvent having a boiling temperature between 100° C. and 300° C. A method as in any above, where the at least one additive comprises a solvent having a boiling temperature between 150° C. and 250° C.

A method as in any above, where the at least one additive comprises a high molecular weight polymer that is too large to penetrate the pores of the dielectric material. A method as in any above, where the at least one additive comprises a high molecular weight polymer having a molecular weight about or greater than 2000 g/mol. A method as in any above, where the at least one additive comprises a high molecular weight polymer having a molecular weight about or greater than 10000 g/mol. A method as in any above, where the at least one additive is selected based on one or more of: a thickness of the first layer, the dielectric material, the filling material, a temperature used to heat the structure and enable the filling material to at least partially fill the plurality of pores, a heating time, and pore size of the plurality of pores. A method as in any above, where the at least one additive comprises the surfactant. A method as in any above, where the at least one additive comprises the high molecular weight polymer. A method as in any above, where the at least one additive comprises the solvent. A method as in any above, where heating the structure results in the residual filling material being uniformly left across an area of the surface of the first layer. A method as in any above, where the at least one additive comprises a solvent having a boiling temperature greater than 150° C.

A method as in any above, implemented as a computer program. A method as in any above, implemented as a program of instructions stored (e.g., tangibly embodied) on a program storage device (e.g., at least one memory, at least one computer-readable medium) and executable by a machine (e.g., at least one processor). A method as in any above, further comprising one or more aspects of the exemplary embodiments of the invention as described further herein.

(2) In another exemplary embodiment of the invention, a program storage device readable by a machine, tangibly embodying a program of instructions executable by the machine for performing operations, said operations comprising: providing a structure comprising a first layer overlying a substrate, where the first layer comprises a dielectric material having a plurality of pores (601); applying a filling material to a surface of the first layer, where the filling material comprises a polymer and at least one additive, where the at least one additive comprises at least one of a surfactant, a high molecular weight polymer and a solvent (602); and after applying the filling material, heating the structure to enable the filling material to at least partially fill the plurality of pores uniformly across an area of the first layer, where heating the structure results in residual filling material being uniformly left on the surface of the first layer (603).

A program storage device as in any above, where the program storage device comprises at least one memory or at least one computer-readable medium. A program storage device as in any above, where the machine comprises a computer or at least one processor configured to execute the program of instructions. A program storage device as in any above, further comprising one or more aspects of the exemplary embodiments of the invention as described further herein.

Figure 17:
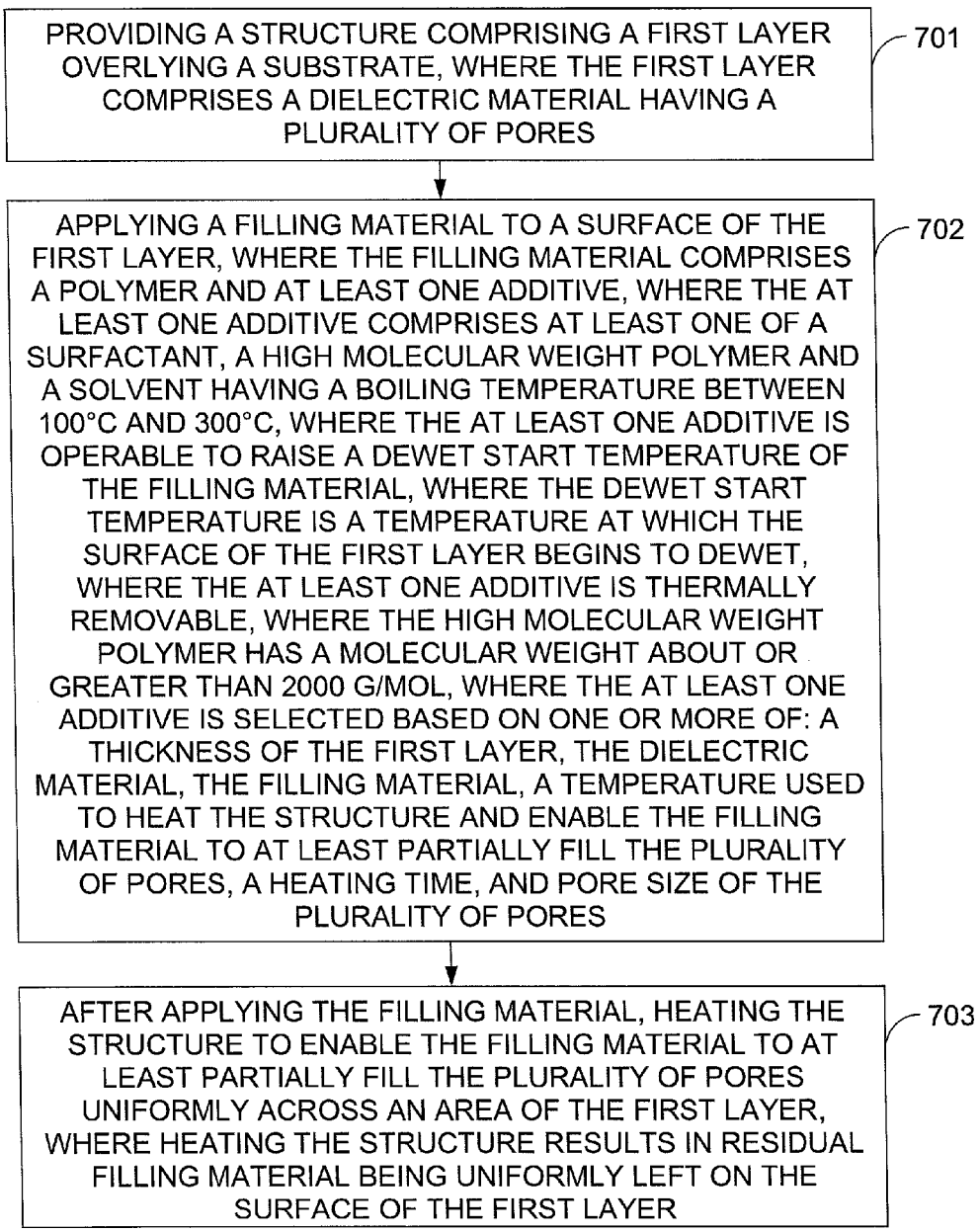
FIG. 17 depicts a flowchart illustrating another, non-limiting example of a method, and execution of program instructions, for practicing the exemplary embodiments of this invention.

(3) In a further exemplary embodiment of the invention, and as shown in FIG. 17, a method comprising: providing a structure comprising a first layer overlying a substrate, where the first layer comprises a dielectric material having a plurality of pores (701); applying a filling material to a surface of the first layer, where the filling material comprises a polymer and at least one additive, where the at least one additive comprises at least one of a surfactant, a high molecular weight polymer and a solvent having a boiling temperature between 100° C. and 300° C., where the at least one additive is operable to raise a dewet start temperature of the filling material, where the dewet start temperature is a temperature at which the surface of the first layer begins to dewet, where the at least one additive is thermally removable, where the high molecular weight polymer has a molecular weight about or greater than 2000 g/mol, where the at least one additive is selected based on one or more of: a thickness of the first layer, the dielectric material, the filling material, a temperature used to heat the structure and enable the filling material to at least partially fill the plurality of pores, a heating time, and pore size of the plurality of pores (702); and after applying the filling material, heating the structure to enable the filling material to at least partially fill the plurality of pores uniformly across an area of the first layer, where heating the structure results in residual filling material being uniformly left on the surface of the first layer (703).

A method as in any above, implemented as a computer program. A method as in any above, implemented as a program of instructions stored (e.g., tangibly embodied) on a program storage device (e.g., at least one memory, at least one computer-readable medium) and executable by a computer (e.g., at least one processor). A method as in any above, further comprising one or more aspects of the exemplary embodiments of the invention as described further herein.

(4) In another exemplary embodiment of the invention, a program storage device readable by a machine, tangibly embodying a program of instructions executable by the machine for performing operations, said operations comprising: providing a structure comprising a first layer overlying a substrate, where the first layer comprises a dielectric material having a plurality of pores (701); applying a filling material to a surface of the first layer, where the filling material comprises a polymer and at least one additive, where the at least one additive comprises at least one of a surfactant, a high molecular weight polymer and a solvent having a boiling temperature between 100° C. and 300° C., where the at least one additive is operable to raise a dewet start temperature of the filling material, where the dewet start temperature is a temperature at which the surface of the first layer begins to dewet, where the at least one additive is thermally removable, where the high molecular weight polymer has a molecular weight about or greater than 2000 g/mol, where the at least one additive is selected based on one or more of: a thickness of the first layer, the dielectric material, the filling material, a temperature used to heat the structure and enable the filling material to at least partially fill the plurality of pores, a heating time, and pore size of the plurality of pores (702); and after applying the filling material, heating the structure to enable the filling material to at least partially fill the plurality of pores uniformly across an area of the first layer, where heating the structure results in residual filling material being uniformly left on the surface of the first layer (703).

A program storage device as in any above, where the program storage device comprises at least one memory or at least one computer-readable medium. A program storage device as in any above, where the machine comprises a computer or at least one processor configured to execute the program of instructions. A program storage device as in any above, further comprising one or more aspects of the exemplary embodiments of the invention as described further herein.

(5-1) A method for forming a porous dielectric material layer in an electronic structure comprising the steps of: providing a pre-processed electronic substrate, forming thereon a layer of fully cured first porous dielectric material which has achieved its full shrinkage, depositing on top of the porous dielectric material a layer of polymer with a stabilizing agent, heating the system above the Tg of the polymer to homogeneously fill the porosity without observing dewetting of polymer layer on dielectric surface, defining and patterning interconnect pattern openings in said non-porous dielectric material, filling said interconnect pattern openings with an electrically conductive material, planarizing said electrically conductive material by chemical mechanical polishing and heating said electronic substrate to a first temperature high enough to drive out said organic polymer from said pores thus transforming said pore-filled dielectric into a second porous dielectric material where the film structure and composition are homogeneous between the bulk and the line sidewalls and bottom, thus indicating little or no plasma damage during processing.

(5-2) A method for forming said second porous dielectric material layer in an electronic structure according to 5-1, wherein said first porous dielectric material is substantially made of silicon containing dielectrics selected from the group comprising silicon oxide, methylsilsesquioxane, hydrogensilsesquioxane, oxycarbosilanes and copolymers thereof.

(5-3) A method for forming a second porous dielectric material layer in an electronic structure according to 5-1, wherein said organic polymer used for filling said pores in said first porous dielectric is selected from the group comprising: poly (2-alkyl oxazolines), poly(N,N-dialkylacrylamides), poly (caprolactones), polyesters, polylactides, polystyrenes, substituted polystyrenes, poly-alpha methylstyrene, substituted poly-alpha methyl polystyrenes, aliphatic polyolefins, polynorbornenes, polyacrylates, polymethacrylates, poly (alkyl oxazolines), polyethers and copolymers thereof. Polymers and copolymers of polyethylene oxide, polypropylene oxide and polytetrahydrofuran also may be used.

(5-4) A method for forming a second porous dielectric material layer in an electronic structure according to 5-1, wherein said the stabilizing agent used for preventing dewetting of polymer layer on dielectric surface is selected from the group of amphiphilic surfactants comprising block or graft copolymers such as poly(styrene-co-ethylene oxide), poly(styrene-co-propylene oxide), poly(alkane-co-ethylene oxide), poly (alkane-co-propylene oxide), poly(ether-co-lactones), poly (ester-co-carbonates), poly(ethylene oxide-co-propylene oxide), poly(ethylene oxide-co-propylene oxide-co-ethylene oxide) and poly(propylene oxide-co-ethylene oxide-co-propylene oxide), as non-limiting examples.

(5-5) A method for forming a second porous dielectric material layer in an electronic structure according to 5-1, wherein said the stabilizing agent used for preventing dewetting of polymer layer on dielectric surface is selected from the group of polymer compatible diluents with a boiling point higher than the polymer Tg, such as oligo(ethylene glycols), oligo (propylene glycols), N-methylpyrrolidone, dimethylformamide, dimethylsulfoxide, g-butyrolactone, cyclohexanone, cyclopentanone, xylenes, mesitylene.

(5-6) A method for forming said second porous dielectric material layer in an electronic structure according to 5-1, wherein said stabilizing agent is introduced in between about 0.5 wt % and about 95 wt %.

(5-7) A method for forming said second porous dielectric material layer in an electronic structure according to 5-1, wherein said stabilizing agent is fully decomposable by thermal means at temperatures ranging from 300° C. to 450° C.

(5-8) A method for forming a porous dielectric material layer in an electronic structure according to 5-1, further comprising the step of forming a mask layer on top of said layer of non-porous dielectric material.

(5-9) A method according to 5-8, wherein said mask layer is made of at least one material selected from the group consisting of silicon oxide, silicon nitride, silicon carbide, and SiCOH and is deposited at a second temperature below said first temperature required to drive out said organic polymer from said pores.

(5-10) A method for forming a second porous dielectric material layer in an electronic structure according to 5-1, wherein said steps of patterning interconnect pattern openings in said non-porous dielectric material, filling said interconnect pattern openings with an electrically conductive material, and planarizing said electrically conductive material by chemical mechanical polishing are all performed at temperatures less than said first temperature.

(5-11) A method for forming a second porous dielectric material layer in an electronic structure according to 5-1, wherein said first temperature for fully curing said first porous dielectric is between about 350° C. and about 450° C.

(5-12) A method for forming a second porous dielectric material layer in an electronic structure according to 5-1, wherein the thermal cure is ultraviolet (UV) assisted (e.g., to improve the efficiency of the thermal cure).

(5-13) A method for forming said second porous dielectric material layer in an electronic structure according to 5-1, wherein said first and second porous materials have a porosity of between about 25 vol. % and about 80 vol. %.

(5-14) A method for forming a porous dielectric material layer in an electronic structure according to 5-1, wherein said first and second porous dielectric materials preferably have a porosity of between about 25 vol. % and about 60 vol. %.

(5-15) A structure comprising at least one interconnect metal line embedded in a porous dielectric wherein the porous regions of said porous dielectric substantially maintain the same amount of carbon in the bulk of the film and at the liner, metal and cap interfaces from patterning, etching and polishing processes and free of any penetration of said interconnect metal into said porous regions of said porous dielectric.

(5-16) A method of forming the structure of 5-15, comprising the steps of: forming a first porous dielectric material layer that has reached its maximum shrinkage, depositing on top of the porous dielectric material a layer of polymer with a stabilizing agent, heating the system above the Tg of the polymer to homogeneously fill the porosity without observing dewetting of polymer layer on dielectric surface, depositing a hard mask on said nonporous dielectric, patterning a photoresist layer atop said hard mask, etching said hard mask and said nonporous hybrid dielectric using a reactive ion etching process, stripping said photoresist, depositing a conductive liner and seed and overfilling the structure with conductive material, removing the excess of said conductive material, liner, seed and hard-mask using chemical mechanical polishing, removing said polymer from said pores in said first porous dielectric and leaving behind a second porous dielectric in the final structure which is substantially free of process damage from patterning, etching and polishing processes and free of any penetration of said interconnect metal.

(5-17) A method according to 5-16, wherein said small enough molecular weight of said polymer is less than 10000 g/mol and more preferably less than 5000 g/mol.

(5-18) A method according to 5-15 and/or 5-16, wherein said step of removing said polymer from said pores in said first porous dielectric is achieved by a process selected from thermal decomposition and UV radiation assisted thermal decomposition.

(5-19) A method according to 5-16, wherein said thermal decomposition and said UV radiation assisted thermal decomposition are performed at a temperature of about 300° C. to 450° C.

The exemplary embodiments of the invention, as discussed herein and as particularly described with respect to exemplary methods, may be implemented in conjunction with a program storage device (e.g., at least one memory) readable by a machine, tangibly embodying a program of instructions (e.g., a program or computer program) executable by the machine for performing operations. The operations comprise steps of utilizing the exemplary embodiments or steps of the method.

The blocks shown in FIGS. 16 and 17 further may be considered to correspond to one or more functions and/or operations that are performed by one or more components, circuits, chips, apparatus, processors, computer programs and/or function blocks. Any and/or all of the above may be implemented in any practicable solution or arrangement that enables operation in accordance with the exemplary embodiments of the invention as described herein.

In addition, the arrangement of the blocks depicted in FIGS. 16 and 17 should be considered merely exemplary and non-limiting. It should be appreciated that the blocks shown in FIGS. 16 and 17 may correspond to one or more functions and/or operations that may be performed in any order (e.g., any suitable, practicable and/or feasible order) and/or concurrently (e.g., as suitable, practicable and/or feasible) so as to implement one or more of the exemplary embodiments of the invention. In addition, one or more additional functions, operations and/or steps may be utilized in conjunction with those shown in FIGS. 16 and 17 so as to implement one or more further exemplary embodiments of the invention.

That is, the exemplary embodiments of the invention shown in FIGS. 16 and 17 may be utilized, implemented or practiced in conjunction with one or more further aspects in any combination (e.g., any combination that is suitable, practicable and/or feasible) and are not limited only to the steps, blocks, operations and/or functions shown in FIGS. 16 and 17.

Any use of the terms "connected," "coupled" or variants thereof should be interpreted to indicate any such connection or coupling, direct or indirect, between the identified elements. As a non-limiting example, one or more intermediate elements may be present between the "coupled" elements. The connection or coupling between the identified elements may be, as non-limiting examples, physical, electrical, magnetic, logical or any suitable combination thereof in accordance with the described exemplary embodiments. As non-limiting examples, the connection or coupling may comprise one or more printed electrical connections, wires, cables, mediums or any suitable combination thereof.

Generally, various exemplary embodiments of the invention can be implemented in different mediums, such as software, hardware, logic, special purpose circuits or any combination thereof. As a non-limiting example, some aspects may be implemented in software which may be run on a computing device, while other aspects may be implemented in hardware.

The foregoing description has provided by way of exemplary and non-limiting examples a full and informative description of the best method and apparatus presently contemplated by the inventors for carrying out the invention. However, various modifications and adaptations may become apparent to those skilled in the relevant arts in view of the foregoing description, when read in conjunction with the accompanying drawings and the appended claims. However, all such and similar modifications will still fall within the scope of the teachings of the exemplary embodiments of the invention.

Furthermore, some of the features of the preferred embodiments of this invention could be used to advantage without the corresponding use of other features. As such, the foregoing description should be considered as merely illustrative of the principles of the invention, and not in limitation thereof.

What is claimed is:

1. A method comprising:
providing a structure comprising a first layer overlying a substrate, where the first layer comprises a dielectric material having a plurality of pores;
applying a filling material to a surface of the first layer, where the filling material comprises a polymer and at least one additive, where the at least one additive comprises at least one of a surfactant, a high molecular weight polymer and a solvent, and where the at least one additive is operable to reduce or eliminate dewetting of excess filling material; and
after applying the filling material, heating the structure to enable the filling material to at least partially fill the plurality of pores uniformly across an area of the first layer, where heating the structure results in residual filling material being uniformly left on the surface of the first layer.

2. The method of claim 1, where the at least one additive is operable to raise a dewet start temperature of the filling material, where the dewet start temperature is a temperature at which the filling material on the surface of the first layer begins to dewet.

3. The method of claim 1, where the at least one additive is thermally removable.

4. The method of claim 1, where the at least one additive comprises a solvent having a boiling temperature between 100° C. and 300° C.

5. The method of claim 1, where the at least one additive comprises a solvent having a boiling temperature between 150° C. and 250° C.

6. The method of claim 1, where the at least one additive comprises a high molecular weight polymer that is too large to penetrate the pores of the dielectric material.

7. The method of claim 1, where the at least one additive comprises a high molecular weight polymer having molecular weight about or greater than 2000 g/mol.

8. The method of claim 1, where the at least one additive comprises a high molecular weight polymer having a molecular weight about or greater than 10000 g/mol.

9. The method of claim 1, where the at least one additive is selected based on one or more of: a thickness of the first layer, the dielectric material, the filling material, a temperature used to heat the structure and enable the filling material to at least partially fill the plurality of pores, a heating time, and pore size of the plurality of pores.

10. The method of claim 1, where the at least one additive comprises the surfactant.

11. The method of claim 1, where the at least one additive comprises the high molecular weight polymer.

12. The method of claim 1, where the at least one additive comprises a high boiling point solvent.

13. The method of claim 1, where heating the structure results in the residual filling material being uniformly left across an area of the surface of the first layer.

14. A method comprising:
providing a structure comprising a first layer overlying a substrate, where the first layer comprises a dielectric material having a plurality of pores;
applying a filling material to a surface of the first layer, where the filling material comprises a polymer and at least one additive, where the at least one additive comprises at least one of a surfactant, a high molecular weight polymer and a solvent having a boiling temperature greater than 150° C., where the at least one additive is operable to raise a dewet start temperature of the filling material, where the dewet start temperature is a temperature at which the surface of the first layer begins to dewet, where the at least one additive is thermally removable, where the high molecular weight polymer has a molecular weight about or greater than 2000 g/mol, where the at least one additive is selected based on one or more of: a thickness of the first layer, the dielectric material, the filling material, a temperature used to heat the structure and enable the filling material to at least partially fill the plurality of pores, a heating time, and pore size of the plurality of pores; and
applying the filling material, heating the structure to enable the filling material to at least partially fill the plurality of pores uniformly across an area of the first layer, where heating the structure results in residual filling material being uniformly left on surface of the first layer.

15. The method of claim 14, where the at least one additive is thermally removable.

16. The method of claim 14, where heating the structure results in the residual filling material being uniformly left across an area of the surface of the first layer.

* * * * *